(12) United States Patent
Lee

(10) Patent No.: US 10,388,356 B2
(45) Date of Patent: Aug. 20, 2019

(54) MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/724,329

(22) Filed: Oct. 4, 2017

(65) Prior Publication Data

US 2018/0247688 A1 Aug. 30, 2018

(30) Foreign Application Priority Data

Feb. 28, 2017 (KR) .................. 10-2017-0025941

(51) Int. Cl.
| | |
|---|---|
| *G11C 16/04* | (2006.01) |
| *G11C 11/4072* | (2006.01) |
| *G11C 16/08* | (2006.01) |
| *G11C 16/24* | (2006.01) |
| *G11C 16/34* | (2006.01) |
| G11C 11/4096 | (2006.01) |
| G11C 11/408 | (2006.01) |

(52) U.S. Cl.
CPC .......... *G11C 11/4072* (2013.01); *G11C 16/08* (2013.01); *G11C 16/24* (2013.01); *G11C 16/3459* (2013.01); *G11C 11/4087* (2013.01); *G11C 11/4096* (2013.01); *G11C 16/0483* (2013.01); *G11C 2211/5648* (2013.01)

(58) Field of Classification Search
CPC ............ G11C 11/4072; G11C 11/4087; G11C 11/4096
See application file for complete search history.

(56) References Cited

U.S. PATENT DOCUMENTS

| | | | |
|---|---|---|---|
| 9,251,910 B2 | 2/2016 | Kim et al. | |
| 9,627,071 B2 * | 4/2017 | Lim ........................ | G11C 16/10 |
| 9,679,660 B1 * | 6/2017 | Bae ........................ | G11C 16/08 |
| 9,899,093 B2 * | 2/2018 | Lee ......................... | G11C 16/10 |

(Continued)

FOREIGN PATENT DOCUMENTS

| | | |
|---|---|---|
| KR | 1020110051206 A | 5/2011 |
| KR | 1020120061566 A | 6/2012 |

(Continued)

*Primary Examiner* — Pho M Luu
(74) *Attorney, Agent, or Firm* — William Park & Associates Ltd.

(57) ABSTRACT

A memory device includes a memory block coupled to a plurality of word lines arranged in parallel with each other between a first select line and a second select line, peripheral circuits supplying a verify voltage and a pass voltage to the first select line, the second select line, and the word lines, selectively discharging the first select line, the second select line and the word lines, and verifying memory cells coupled to a selected word line of the word lines, and a control logic controlling the peripheral circuits so that potentials of the selected word line, unselected word lines and the first and second select lines are the same as each other after verifying the memory cells and the first and second select lines are discharged after discharging the selected and unselected word lines, and an operating method thereof.

23 Claims, 17 Drawing Sheets

(56) References Cited

U.S. PATENT DOCUMENTS

2012/0170376 A1* 7/2012 Lee ........................ G11C 16/14
                                                365/185.22
2018/0247688 A1   8/2018 Lee

FOREIGN PATENT DOCUMENTS

| KR | 101184539 B1 | 9/2012 |
| KR | 101705294 B1 | 2/2017 |
| KR | 1020170094659 A | 8/2017 |

* cited by examiner

MEMORY DEVICE AND OPERATING METHOD THEREOF

CROSS-REFERENCE TO RELATED APPLICATION

The present application claims priority under 35 U.S.C. § 119(a) to Korean patent application number 10-2017-0025941 filed on Feb. 28, 2017, in the Korean Intellectual Property Office, the entire disclosure of which is incorporated by reference herein.

BACKGROUND

1. Technical Field

Various embodiments relate generally to a memory device and a method of operating the same and, more particularly, to a verify operation and a read operation of a memory device.

2. Related Art

A memory device may have a two-dimensional structure in which a string is arranged in a horizontal direction with respect to a semiconductor substrate, or a three-dimensional structure in which a string is arranged in a vertical direction with respect to a semiconductor device. Three-dimensionally structured memory devices have been designed to overcome a limited integration density of two-dimensionally structured memory devices. A three-dimensionally structured memory device may include a plurality of memory cells stacked in a vertical direction to a semiconductor device.

SUMMARY

Various embodiments relate to a memory device capable of improving reliability of the memory device and a method of operating the memory device.

A memory device according to an embodiment may include a memory block coupled to a plurality of word lines arranged in parallel with each other between a first select line and a second select line; peripheral circuits supplying a verify voltage and a pass voltage to the first select line, the second select line, and the word lines, selectively discharging the first select line, the second select line and the word lines, and verifying memory cells coupled to a selected word line of the word lines; and a control logic controlling the peripheral circuits so that potentials of the selected word line, unselected word lines, and the first and second select lines are the same as each other after verifying the memory cells, and the first and second select lines are discharged after discharging the selected and unselected word lines.

A method of operating a memory device according to an embodiment may include applying pass voltages to unselected word lines, among word lines, and select lines; verifying memory cells coupled to a selected word line, among the word lines, by applying a verify voltage to the selected word line; applying a turn on voltage to the selected word line when the pass voltages are applied to the unselected word lines and the select lines; discharging the selected word line and the unselected word lines; and discharging the select lines after discharging the selected word line and the unselected word lines.

DETAILED DESCRIPTION

Hereinafter, various examples of embodiments will be described in detail with reference to the accompanying drawings. The figures are provided to allow those of ordinary skill in the art to understand a scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey a scope of the invention to those skilled in the art.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, the other element does not intervene therebetween. Other expressions which describe the relationship between components, that is, "between" and "directly between", or "adjacent to" and "directly adjacent to" need to be interpreted in the same manner.

Figure 1:
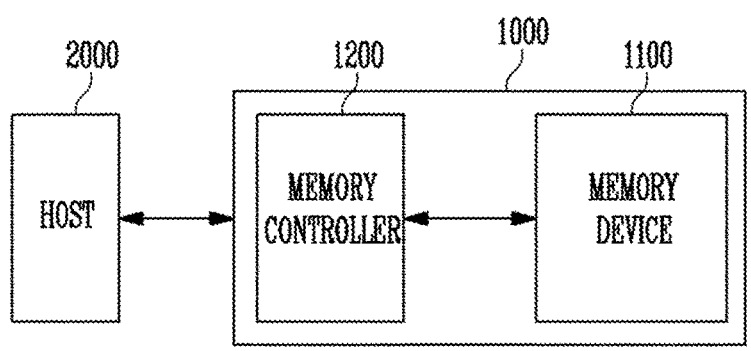
FIG. 1 is a diagram illustrating a memory system according to an embodiment.

FIG. 1 is a diagram illustrating a memory system 1000 according to an embodiment.

Referring to FIG. 1, the memory system 1000 may include a memory device 1100 storing data and a memory controller 1200 controlling the memory device 1100 in response to control of the host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or serial attached SCSI (SAS). However, interface protocols between the host 2000 and the memory system 1000 are not limited thereto. The host 2000 may communicate with the memory system 1000 by using one of other interface protocols such as a Universal Serial Bus (USB), a Multi-Media Card (MMC), an Enhanced Small Disk Interface (ESDI), or Integrated Drive Electronics (IDE).

The memory controller 1200 may control general operations of the memory system 1000 and control data exchanged between host 2000 and the memory device 1100. For example, the memory controller 1200 may control the memory device 1100 to program or read data in response to a request from the host 2000. In addition, the memory controller 1200 may store information about main memory blocks and sub-memory blocks included in the memory device 1100, and select the memory device 1100 to perform a program operation on a main memory block or a sub-memory block according to the amount of data loaded for the program operation. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory.

The memory controller 1200 may control the memory device 1100 to perform a program, read, or erase operation.

Figure 2:
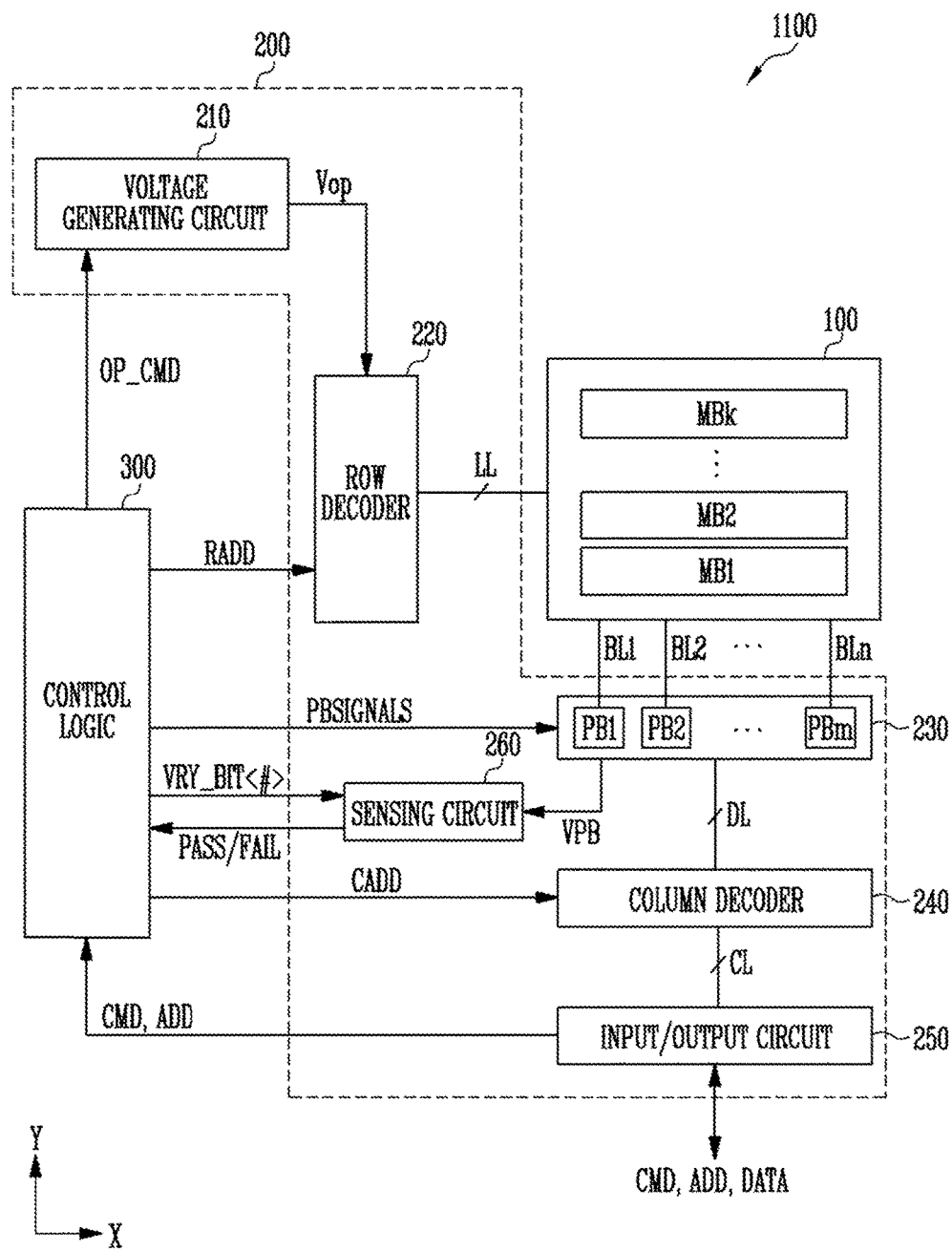
FIG. 2 is a diagram illustrating a memory device shown in FIG. 1.

FIG. 2 is a diagram illustrating the memory device 1100 shown in FIG. 1.

Referring to FIG. 2, the memory device 1100 may include a memory cell array 100 which stores data therein. The memory device 1100 may include peripheral circuits 200 configured to perform a program operation to store data in the memory cell array 100, a read operation to output the stored data, and an erase operation to erase the stored data. The memory device 1100 may include a control logic 300 which controls the peripheral circuits 200 in response to control of the memory controller 1200 shown in FIG. 1.

The memory cell array 100 may include a plurality of memory blocks MB1 to MBk, where k is a positive integer. Local lines LL and bit lines BL1 to BLn may be coupled to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines. For example, the local lines LL may further include dummy lines. For example, the local lines LL may further include pipe lines. According to an embodiment, the word lines may be divided into a plurality of groups. According to an embodiment, during a verify operation or a read operation, each of the groups including the word lines may be sequentially discharged.

The local lines LL may be coupled to the memory blocks MB1 to MBk, respectively. The bit lines BL1 to BLn may be commonly coupled to the memory blocks MB1 to MBk. The memory blocks MB1 to MBk may have a two-dimensional or three-dimensional structure. For example, in two-dimensionally structured memory blocks, pages may be arranged in a direction parallel to a substrate. In another example, in three-dimensionally structured memory blocks, pages may be arranged in a vertical direction to a substrate.

The control logic 300 may control the peripheral circuits 200 to perform program, read and erase operations on a selected memory block. For example, the control logic 300 may control the peripheral circuits 200 to supply a verify voltage and pass voltages to the first select line, the second select line and the word lines, selectively discharge the first select line, the second select line and the word lines, and verify memory cells coupled to a selected word line, among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used to perform program, read and erase operations in response to an operation signal OP_CMD. In addition, the voltage generating circuit 210 may selectively discharge the local lines LL in response to the operation signal OP_CMD. For example, the control logic 300 may control the voltage generating circuit 210 to generate a program voltage, a verify voltage, pass voltages, a turn on voltage, a read voltage, an erase voltage, and a source line voltage. For example, in response to control of the control logic 300, during a verify operation or a read operation, the voltage generating circuit 210 may adjust a source line voltage applied to a source line and pass voltages applied to source select lines and drain select lines, or sequentially discharge the groups of the word lines. For example, in response to control of the control logic 300, during a verify operation or a read operation, the voltage generating circuit 210 may simultaneously discharge unselected word lines when discharging word lines of a group including a selected word line. The pass voltages may be applied to form a channel in a string and set to have various levels.

The row decoder 220 may transfer the operating voltages Vop to the local lines LL coupled to the selected memory block in response to a row address RADD.

The page buffer group 230 may include a plurality of page buffers PB1 to PBn coupled to the bit lines BL1 to BLn. The page buffers PB1 to PBn may operate in response to page buffer control signals PBSIGNALS. For example, the page buffers PB1 to PBn may temporarily store data received through the bit lines BL1 to BLn, or sense a voltage or current in the bit lines BL1 to BLn during a read or verify operation.

The column decoder 240 may transfer data between the input/output circuit 250 and the page buffer group 230 in response to a column address CADD. For example, the column decoder 240 may exchange data with page buffers PB through the data lines DL, or exchange data with the input/output circuit 250 through column lines CL.

The input/output circuit 250 may transfer the command CMD and the address ADD from the memory controller 1200 shown in FIG. 1 to the control logic 300, or exchange data DATA with the column decoder 240.

The sensing circuit 260 may generate a reference current in response to an allowable bit VRY_BIT<#> and compare a sensing voltage VPB received from the page buffer group 230 with a reference voltage generated by the reference current to output a pass signal PASS or a fail signal FAIL during a read operation or a verify operation.

The control logic 300 may output the operation signal OP_CMD, the row address RADD, the page buffer control signals PBSIGNALS, and the allowable bit VRY_BIT<#> to control the peripheral circuits 200 in response to the command CMD and the address ADD. In addition, the control logic 300 may determine whether a verify operation passes or fails in response to the pass or fail signal PASS or FAIL. More specifically, during a verify operation or a read operation, the control logic 300 may adjust the source line voltage applied to the source line and the pass voltages applied to the source select lines and the drain select lines, and control the peripheral circuits 200 so that the groups of word lines may be sequentially discharged. For example, after the control logic 300 verifies memory cells, the control logic 300 may control the peripheral circuits 200 to increase a voltage of a selected word line to turn on memory cells coupled to the selected word line. For example, the control logic 300 may control the peripheral circuits 200 so that the selected word line, unselected word lines, and the first and second select lines may have similar or the same potentials after verifying the memory cells, and may control the peripheral circuits 200 so that at least one of the first and second select lines may be discharged after the selected word lines and the unselected word lines are discharged.

Figure 3:
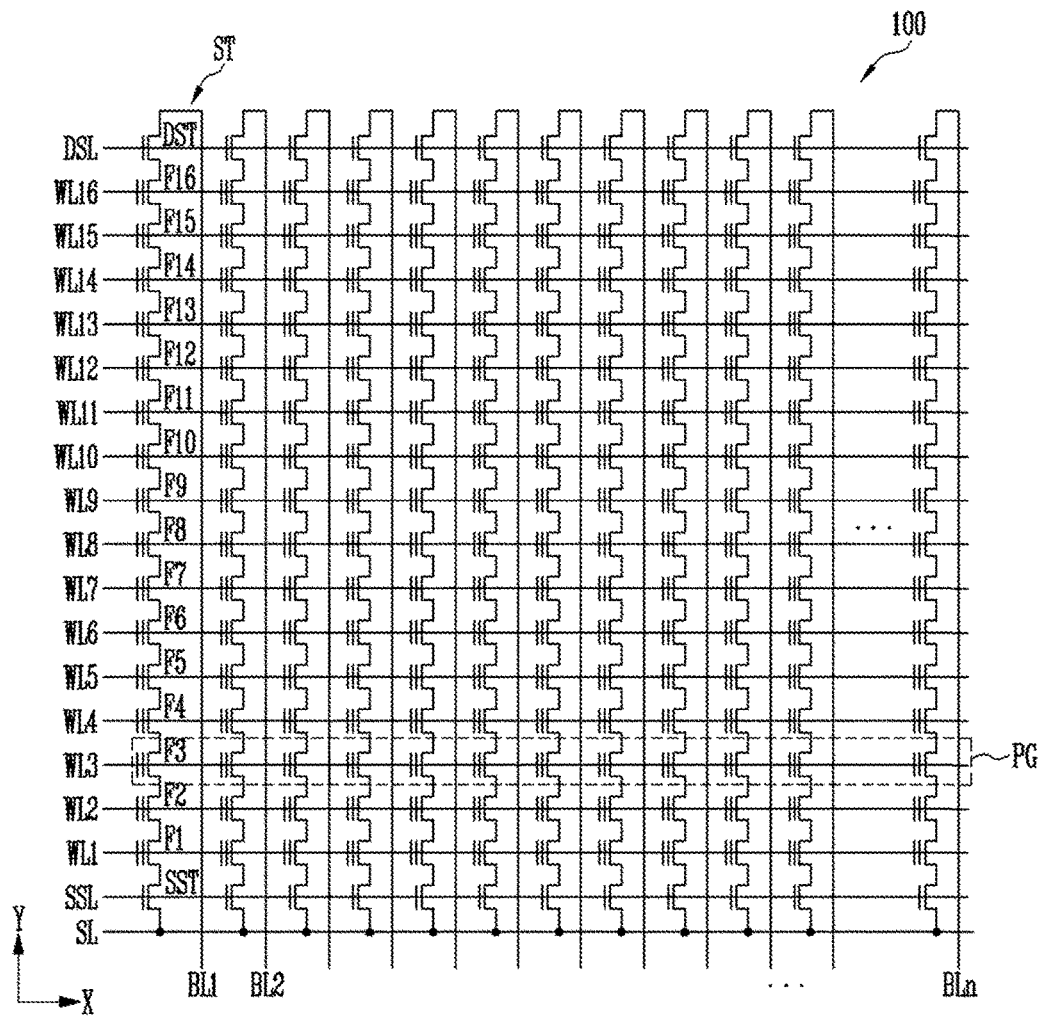
FIG. 3 is a diagram illustrating a memory block shown in FIG. 2.

FIG. 3 is a diagram illustrating a memory block shown in FIG. 2.

Referring to FIG. 3, the memory block may be coupled to a plurality of word lines arranged in parallel with each other between a first select line and a second select line. The first select line may be a source select line SSL and the second select line may be a drain select line DSL. More specifically, the memory block may include a plurality of strings ST coupled between the bit lines BL1 to BLn and a source line SL. Each of the bit lines BL1 to BLn may be coupled to each of the strings ST, and the source line SL may be commonly coupled to the strings ST. Since the strings ST may have similar configurations to each other, the string ST coupled to the first bit line BL1 will be described in detail as an example.

The string ST may include a source selection transistor SST, a plurality of memory cells F1 to F16, and a drain selection transistor DST coupled in series between the source line SL and the first bit line BL1. At least one source selection transistor SST and at least one drain selection transistor DST may be included in one string ST. The string ST may include more memory cells than the memory cells F1 to F16 as shown in FIG. 3.

A source of the source selection transistor SST may be coupled to the source line SL, and a drain of the drain selection transistor DST may be coupled to the first bit line BL1. The memory cells F1 to F16 may be coupled in series between the source selection transistor SST and the drain selection transistor DST. Gates of the source selection transistors SST included in different strings ST may be coupled to the source select line SSL, gates of the drain selection transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a page PG. Therefore, the memory block may include as many pages PG as the number of word lines WL1 to WL16.

Figure 4:
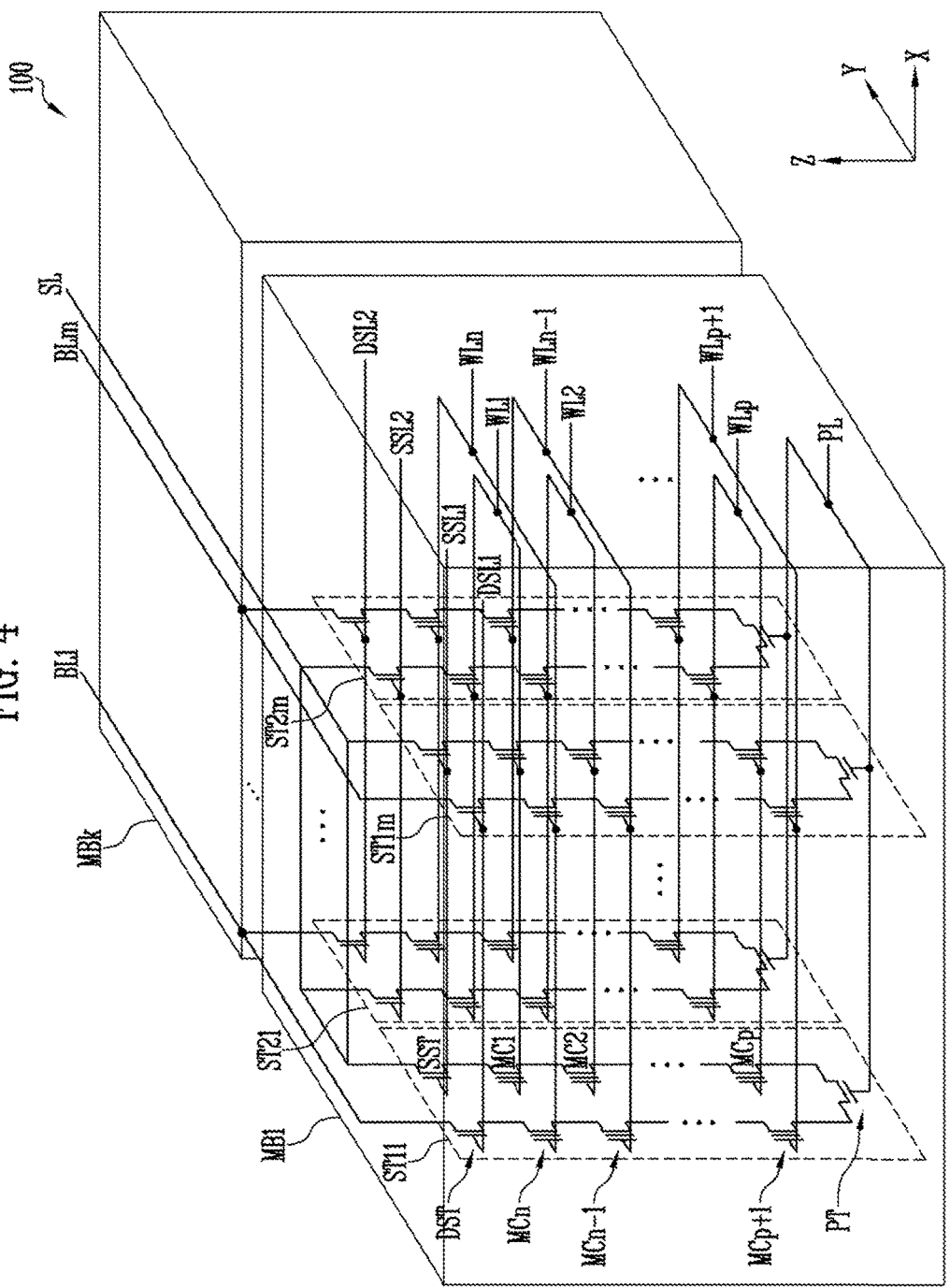
FIG. 4 is a diagram illustrating an embodiment of a memory block having a three-dimensional structure.

FIG. 4 is a diagram illustrating an embodiment of a three-dimensionally structured memory block.

Referring to FIG. 4, the memory cell array 100 may include a plurality of memory blocks MB1 to MBk. For illustrative purposes, FIG. 4 shows the internal configuration of the first memory block MB1 and omits the internal configurations of the remaining memory blocks MB2 to MBk. Each of the second to kth memory blocks MB2 to MBk may have the same configuration as the first memory block MB1.

The first memory block MB1 may include a plurality of strings ST11 to ST1m and ST21 to ST2m. According to an embodiment, each of the plurality of strings ST11 to ST1m and ST21 to ST2m may have a 'U' shape. In the first memory block MB1, 'm' strings may be arranged in a row direction (X direction). For convenience of explanation, FIG. 4 illustrates only two strings arranged in a column direction (Y direction). However, three or more strings may also be arranged in the column direction (Y direction).

Each of the plurality of strings ST11 to ST1m and ST21 to ST2m may include at least one source selection transistor SST, first to nth memory cells MC1 to MCn, a pipe transistor PT, and at least one drain selection transistor DST.

The source and drain selection transistors SST and DST and the memory cells MC1 to MCn may have similar structures to each other. For example, each of the source and drain selection transistors SST and DST and the memory cells MC1 to MCn may include a channel layer, a tunnel insulating layer, a charge trap layer, and a blocking insulating layer. For example, a pillar for providing a channel layer may be provided in each string. For example, a pillar for providing at least one of the channel layer, the tunnel insulating layer, the charge trap layer, and the blocking insulating layer may be provided in each string.

The source selection transistor SST of each string may be coupled between the source line SL and memory cells MC1 to MCp.

According to an embodiment, source selection transistors of strings arranged in the same row may be coupled to a source select line extending in a row direction, and source selection transistors of strings arranged in different rows may be coupled to different source select lines. As shown in FIG. 4, source selection transistors of the strings ST11 to ST1m in the first row may be coupled to a first source select line SSL1, and source selection transistors of the strings ST21 to ST2m in the second row may be coupled to a second source select line SSL2.

According to another embodiment, the source selection transistors of the strings ST11 to ST1m and ST21 to ST2m may be commonly coupled to a single source select line.

The first to nth memory cells MC1 to MCn of each string may be coupled between the source selection transistor SST and the drain selection transistor DST.

The first to nth memory cells MC1 to MCn may be divided in to first to pth memory cells MC1 to MCp and (p+1)th to nth memory cells MCp+1 to MCn. The first to pth memory cells MC1 to MCp may be sequentially arranged in a vertical direction (Z direction) and coupled in series between the source selection transistor SST and the pipe transistor PT. The (p+1)th to nth memory cells MCp+1 to MCn may be sequentially arranged in the vertical direction (Z direction) and coupled in series between the pipe transistor PT and the drain selection transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

According to an embodiment, at least one of the first to nth memory cells MC1 to MCn may serve as a dummy memory cell. When a dummy memory cell is provided, a voltage or current of the corresponding string may be stably controlled. A gate of the pipe transistor PT of each string may be coupled to a pipe line PL.

The drain selection transistor DST of each string may be coupled between the bit line and the memory cells MCp+1 to MCn. Strings arranged in a row direction may be coupled to a drain select line extending in the row direction. Drain selection transistors of the strings ST11 to ST1m in the first row may be coupled to a first drain select line DSL1. Drain selection transistors of the strings ST21 to ST2m in the second row may be coupled to a second drain select line DSL2.

Strings arranged in a column direction may be coupled to bit lines extending in the column direction. As shown in FIG. 4, the strings ST11 and ST21 in the first column may be coupled to the first bit line BL1. The strings ST1m and ST2m in the mth column may be coupled to the mth bit line BLm.

Memory cells coupled to the same word line, among strings arranged in the row direction, may form a single page. For example, memory cells coupled to the first word line WL1 of the strings ST11 to ST1m in the first row may form a single page, and memory cells coupled to the first word line WL1 of the strings ST21 to ST2m in the second row may form another page. When one of the drain select lines DSL1 and DSL2 is selected, strings arranged in the row direction may be selected. One page of selected strings may be selected when one of the word lines WL1 to WLn is selected.

Figure 5:
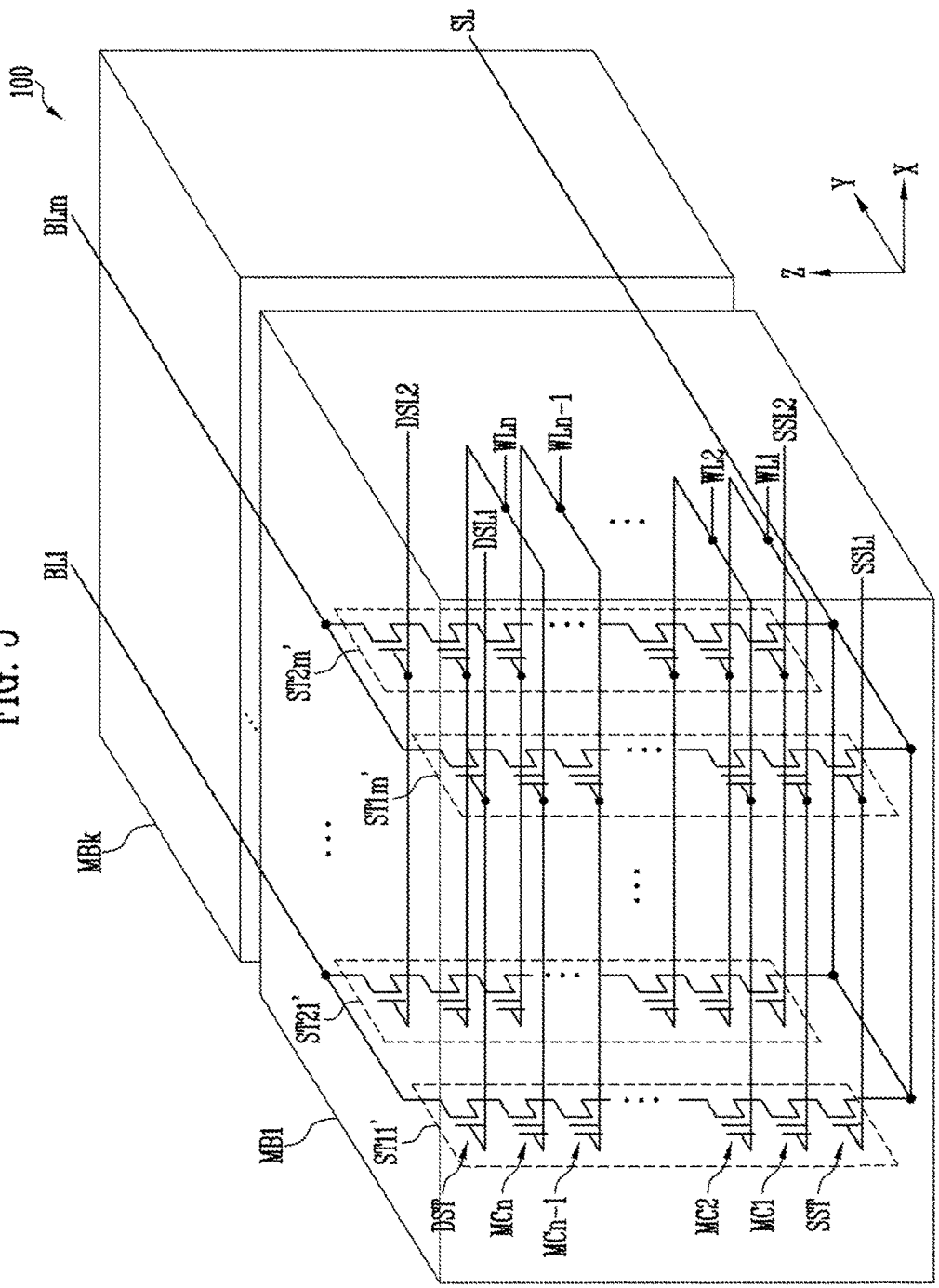
FIG. 5 is a diagram illustrating an embodiment of a memory block having a three-dimensional structure.

FIG. 5 is a diagram illustrating an embodiment of a three-dimensionally structured memory block.

Referring to FIG. 5, the memory cell array 100 may include a plurality of memory blocks MB1 to MBk. For convenience of explanation, FIG. 5 illustrates the internal configuration of the first memory block MB1 and omits the internal configurations of the remaining memory blocks MB2 to MBk. The second to kth memory blocks MB1 to MBk may also be configured in the same manner as the first memory block MB1.

The first memory block MB1 may include a plurality of strings ST11' to ST1m' and ST21' to ST2m'. Each of the plurality of strings ST11' to ST1m' and ST21' to ST2m' may extend in a vertical direction (Z direction). In the first memory block MB1, 'm' strings may be arranged in a row direction (X direction). For convenience of explanation, FIG. 5 illustrates only two strings arranged in a column direction (Y direction). However, three or more strings may also be arranged in the column direction (Y direction).

Each of the plurality of strings ST11' to ST1m' and ST21' to ST2m' may include at least one source selection transistor SST, the first to nth memory cells MC1 to MCn, and at least one drain selection transistor DST.

The source selection transistor SST of each string may be coupled between the source line SL and the memory cells MC1 to MCn. Source selection transistors of strings arranged in the same row may be coupled to the same source select line. Source selection transistors of the strings ST11' to ST1m' arranged in the first row may be coupled to the first source select line SSL1. Source selection transistors of the strings ST21' to ST2m' arranged in the second row may be coupled to the second source select line SSL2. According to another embodiment, the source selection transistors of the strings ST11' to ST1m' and ST21' to ST2m' may be commonly coupled to a single source select line.

The first to nth memory cells MC1 to MCn of each string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When a dummy memory cell is provided, a voltage or current in the corresponding string may be stably controlled. Therefore, the reliability of data stored in the memory block MB1 may be improved.

The drain selection transistor DST of each string may be coupled between the bit line and the memory cells MC1 to MCn. The drain selection transistors DST of the strings arranged in the row direction may be coupled to a drain select line extending in the row direction. The drain selection transistors DST of the strings ST11' to ST1m' in the first row may be coupled to the first drain select line DSL1. The drain selection transistors DST of the strings ST21' to ST2m' in the second row may be coupled to the second drain select line DSL2.

In other words, the memory block MB1 shown in FIG. 5 may have a similar equivalent circuit to the memory block MB1 shown in FIG. 4 except that the pipe transistor PT is removed from each string.

Figure 6:
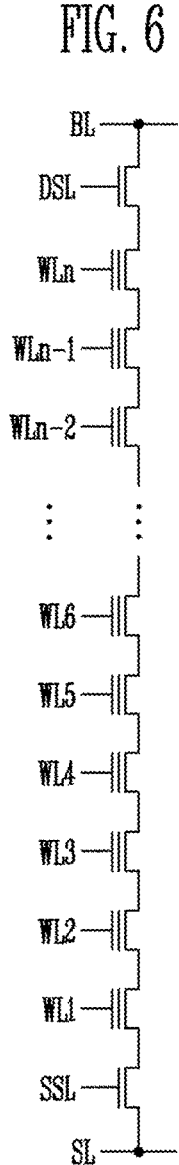
FIGS. 6 and 7 are diagrams illustrating a program operation according to an embodiment of the invention.
Figure 7:
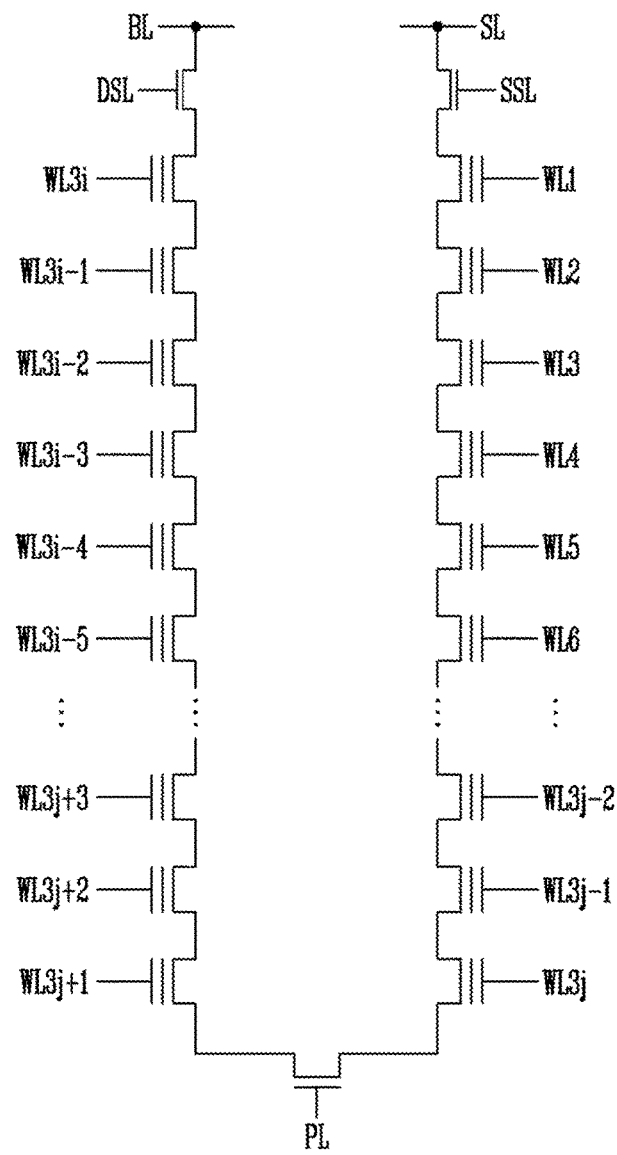

FIGS. 6 and 7 are diagrams illustrating a program operation according to an embodiment.

Referring to FIG. 6, a program operation may be performed in units of a page. A program operation of an I-shaped string coupled between the source line SL and the bit line BL will be described below as an example.

A program operation may be performed by an Incremental Step Pulse Program (ISPP) method in which a program voltage gradually increases as the number of program loops increases. A program loop may include increasing threshold voltages of selected memory cells by applying a program voltage to a selected word line and performing a verify operation to determine whether the threshold voltages of the memory cells increased to a target voltage. A program operation may be performed in a direction from the first page coupled to the first word line WL1 to an nth page coupled to an nth word line WLn, or in an opposite direction thereto. When the program voltage is applied to the selected word line, pass voltages may be applied to unselected word lines. During a verify operation, when a verify voltage is applied to a selected word line, pass voltages may be applied to unselected word lines. The pass voltages applied to the unselected word lines during the program voltage applying operation and the verify operation may be controlled to be the same as each other or different from each other. In one example, the verify voltage may be lower than the pass voltage. When the verify operation finishes, all word lines may be discharged for subsequent operations. An equalize operation may be performed to prevent the potential of the selected word line from being reduced to a negative voltage. For example, during an equalize operation, a voltage of the selected word line may be increased to turn on memory cells coupled to the selected word line. The voltage of the selected word line may be increased so that a voltage applied to the selected word line may be similar to a voltage applied to the unselected word lines. Subsequently, the word lines having the similar voltages may be discharged.

Referring to FIG. 7, a program operation of a U-shaped string coupled between the source line SL and the bit line BL is described below as an example.

The program operation of the U-shaped string as shown in FIG. 7 may be performed in a similar manner as described above with reference to FIG. 6. However, because the string has a U shape, when the program operation is performed in a direction from the first page coupled to the first word line WL1, the program operation may be performed in a sequential order from the first to 3jth pages, and then in a sequential order from (3j+1)th to 3ith pages. When a program operation is performed in an opposite direction, the program operation may be performed first in a sequential order from the 3ith to (3j+1)th pages, and then in a sequential order from the 3jth to the first pages.

The verify operation of the above-described program operation is described below in detail.

Figure 8:
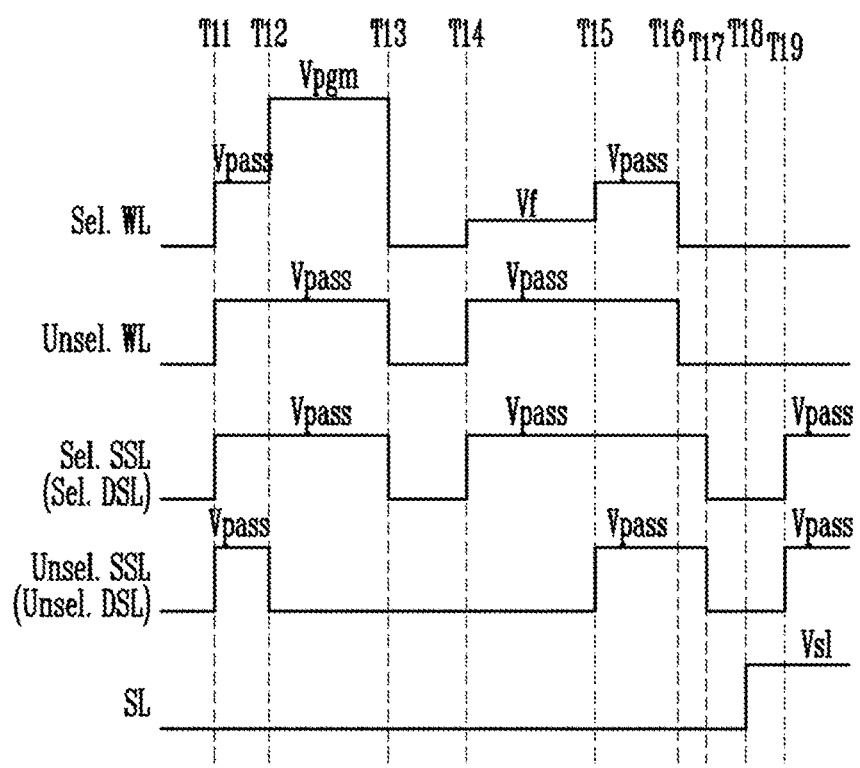
FIGS. 8 to 10 are diagrams illustrating a verify operation according to an embodiment of the invention.
Figure 9:
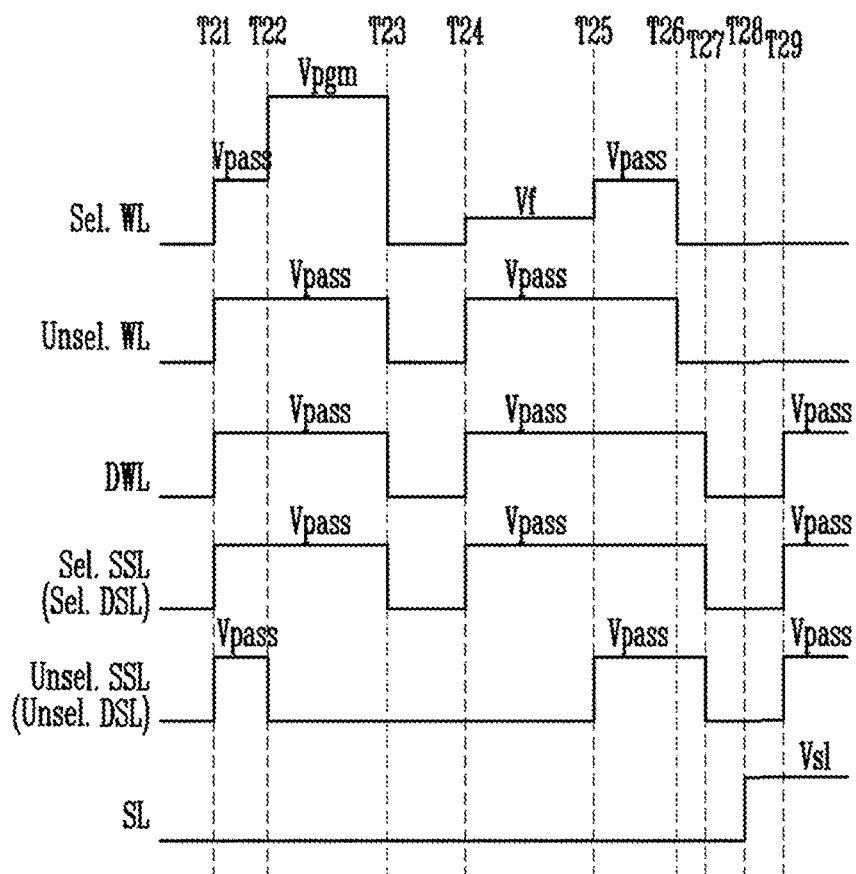
Figure 10:
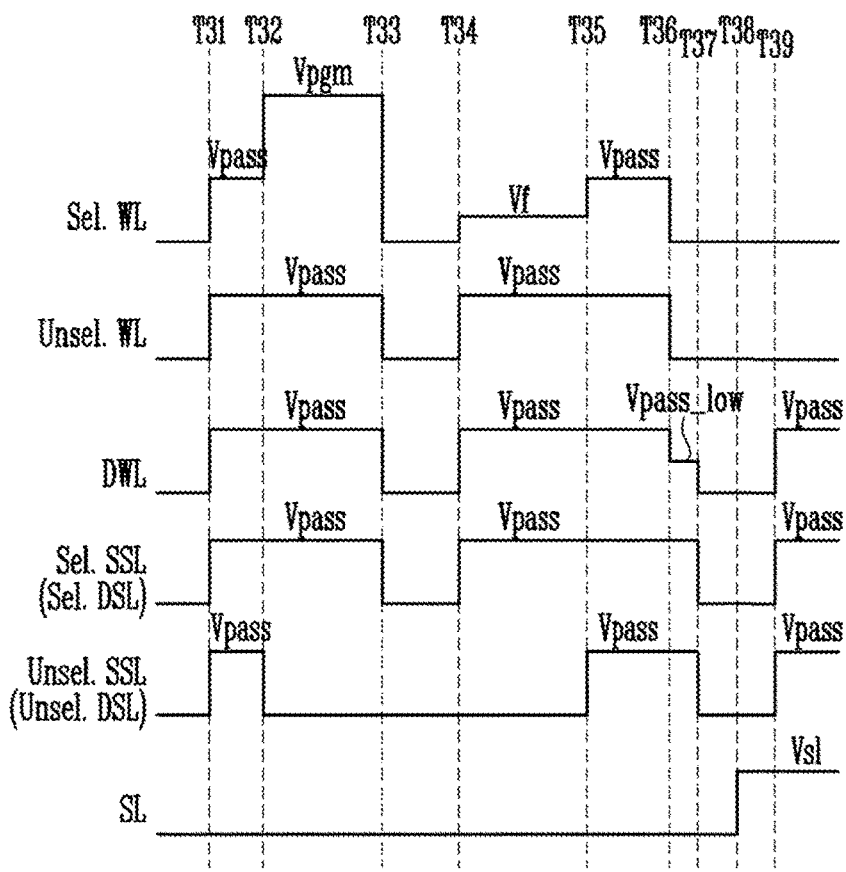

FIGS. 8 to 10 are diagrams illustrating a verify operation according to an embodiment.

FIG. 8 illustrates a single program loop.

The program loop may include a program period (T11 to T13), a first discharge period (T13 to T14), a verify period (T14 to T15), an equalize period (T15 to T16), and a second discharge period (T16 to T18). A precharge period may start from T18. Each period will be described in detail.

When the program period (T11 to T13) starts (T11), pass voltages Vpass may be applied to a selected word line Sel. WL, unselected word lines Unsel. WL, selected source select lines Sel. SSL, and a selected drain select lines Sel. DSL (T11 to T12). According to a precharge method of strings, the pass voltages Vpass or 0V may be selectively applied to the unselected source select lines Unsel. SSL and the unselected drain select lines Unsel. DSL.

The selected word line Sel. WL may be coupled to a target page of the program operation, and the unselected word lines Unsel. WL may be the remaining word lines, except the selected word lines Sel. WL. The selected source select lines Sel. SSL and the selected drain select lines Sel. DSL may be coupled to strings including program target memory cells, and the unselected source select lines Unsel. SSL and the unselected drain select lines Unsel. DSL may be source select lines and drain select lines coupled to the remaining strings.

When the strings are precharged by a positive voltage applied from the bit lines, the pass voltage Vpass may be applied to the unselected source select lines Unsel. SSL and the unselected drain select lines Unsel. DSL. On the other hand, when the strings are precharged by a positive voltage applied from the source line SL, the pass voltages Vpass may be applied to the unselected source select lines Unsel. SSL and the unselected drain select lines Unsel. DSL before the program period T11 to T13. This will be described below in connection with the precharge period (after T18).

When a program voltage applying period (T12 to T13) starts (T12), though not shown in FIG. 8, a program permission voltage or a program inhibition voltage may be applied to the bit lines according to external data from an external device (e.g., memory controller) for a program operation. For example, the program permission voltage may be 0V, and the program inhibition voltage may be a positive voltage. The unselected source select lines Unsel. SSL and the unselected drain select lines Unsel. DSL may be discharged, and a channel voltage of the unselected strings may be increased. A program voltage Vpgm may be applied to the selected word line Sel. WL.

When the program voltage Vpgm is applied to the selected word line Sel. WL for a predetermined time (T13), the first discharge period (T13 to T14) may be performed for the next operation.

All word lines Sel. WL and Unsel. WL, all source select lines Sel. SSL and Unsel. SSL, and all drain select lines Sel. DSL and Unsel. DSL, including the bit lines, may be discharged during the first discharge period (T13 to T14).

When the first discharge period (T13 to T14) finishes (T14), the verify period (T14 to T15) may be performed. When the verify period (T14 to T15) starts, the pass voltages Vpass may be applied to the selected source select lines Sel. SSL, the selected drain select lines Sel. DSL, and the unselected word lines Unsel. WL, and a verify voltage Vf may be applied to the selected word line Sel. WL.

After the verify period (T14 to T15) is performed for a predetermined time, the equalize period (T15 to T16) may be performed. However, the second discharge period (T16 to T19) may be performed without performing the equalize period (T15 to T16). The equalize period (T15 to T16) may be performed to prevent the potential of the selected word line Sel. WL from being reduced to a negative voltage in the second discharge period (T16 to T19). In other words, the equalize period (T15 to T16) may be selectively performed. During the equalize period (T15 to T16), a greater voltage than the verify voltage Vf applied to the selected word line Sel. WL may be applied. For example, a turn on voltage may be applied to the selected word line Sel. WL so that the selected word line Sel. WL and the unselected word lines Unsel. WL may have similar potentials. For example, the turn on voltage may be set to be similar to the pass voltages Vpass. The pass voltages Vpass may also be applied to the unselected source select lines Unsel. SSL and the unselected drain select lines Unsel. DSL. For example, the turn on voltage may be set to a voltage by which the memory cells coupled to the selected word line Sel. WL may be turned on.

During the second discharge period T16 to T18, the word lines Sel. WL and Unsel. WL may be discharged earlier than the select lines Sel. SSL, Sel. DSL, Unsel. SSL, and Unsel. DSL (T16). Subsequently, the select lines Sel. SSL, Sel. DSL, Unsel. SSL, and Unsel. DSL may be discharged (T17). In other words, when the selection transistors (e.g., SST and DST) are turned on, the word lines Sel. WL and Unsel. WL may be discharged. When the selection transistors SST and DST are turned on, channels of the strings may not be floated. Therefore, coupling may be prevented from occurring even when the word lines Sel. WL and Unsel. WL are discharged at the same time. Therefore, the channel voltage of the strings may be prevented from being reduced to the negative voltage, so that changes in threshold voltage distribution of the memory cells may be prevented.

When all lines are discharged, the precharge period (after T18) may be performed for the next program loop. For example, channels of the strings are precharged through the source line SL, a source line voltage Vsl, which is a positive voltage, may be applied to the source line SL (T18). Subsequently, when the pass voltages Vpass are applied to the select lines Sel. SSL, Sel. DSL, Unsel. SSL, and Unsel. DSL, the channels may be precharged while the source line voltage Vsl is supplied to the strings. Though not shown in FIG. 8, when the channels of the strings are precharged, the source line SL, and the select lines Sel. SSL, Sel. DSL, Unsel. SSL, and Unsel. DSL may be charged, and the next program loop may start from T11. As described above, when the channels of the strings are precharged through the source line SL, a ground voltage may continue to be supplied to the unselected source select lines Unsel. SSL and the unselected drain select lines Unsel. DSL during the period (T11 to T12).

FIG. 9 is a diagram illustrating a program operation when strings include dummy cells. Periods T21 to T29 may be performed in the same manner as the periods T11 to T19 as shown in FIG. 8. However, the peripheral circuits 200 shown in FIG. 2 may apply a similar or a same voltage as applied to dummy lines DWL coupled to the dummy cells to the selected source select lines Sel. SSL or the selected drain select lines Sel. DSL at the same time. For example, during a second discharge period (T26 to T28), after the word lines Sel. WL and Unsel. WL are discharged, the peripheral circuits 200 may discharge the dummy lines DWL and the select lines Sel. SSL, Sel. DSL, Unsel. SSL, and Unsel.

DSL. In other words, because substantial data is not stored in the dummy cells, the dummy lines DWL may be controlled in the same manner as the selected source select lines Sel. SSL and Sel. DSL.

Referring to FIG. 10, when the dummy lines DWL are arranged between the select lines Sel. SSL, Sel. DSL, Unsel. SSL, and Unsel. DSL and the word lines Sel. WL and Unsel. WL, the peripheral circuits 200 may discharge the dummy lines DWL in stages during a second discharge period (T36 to T38) when the word lines Sel. WL and Unsel. WL are discharged (T36). In other words, at T36, when the word lines Sel. WL and Unsel. WL are discharged, the potential of the dummy lines DWL may also be reduced. For example, the potential of the dummy lines DWL may decrease from the pass voltage Vpass to another pass voltage Vpass_low. At T37, the dummy lines DWL may be discharged simultaneously with the select lines Sel. SSL, Sel. DSL, Unsel. SSL, and Unsel. DSL. The other pass voltage Vpass_low may be set to be lower than the pass voltages Vpass and greater than 0V. In addition, during the period (T36 to T37), a voltage of the dummy lines DWL may be divided into a plurality of steps and gradually decrease from the pass voltages Vpass to 0V. As described above, when the potential of the dummy lines DWL gradually decreases, potential differences between the memory cells and the select lines may be reduced, and threshold voltage variations of memory cells adjacent to the select lines Sel. SSL, Sel. DSL, Unsel. SSL, and Unsel. DSL may be prevented.

During the above-described program operation, the word lines may be grouped and sequentially discharged. Such a program operation is described below in detail.

Figure 11:
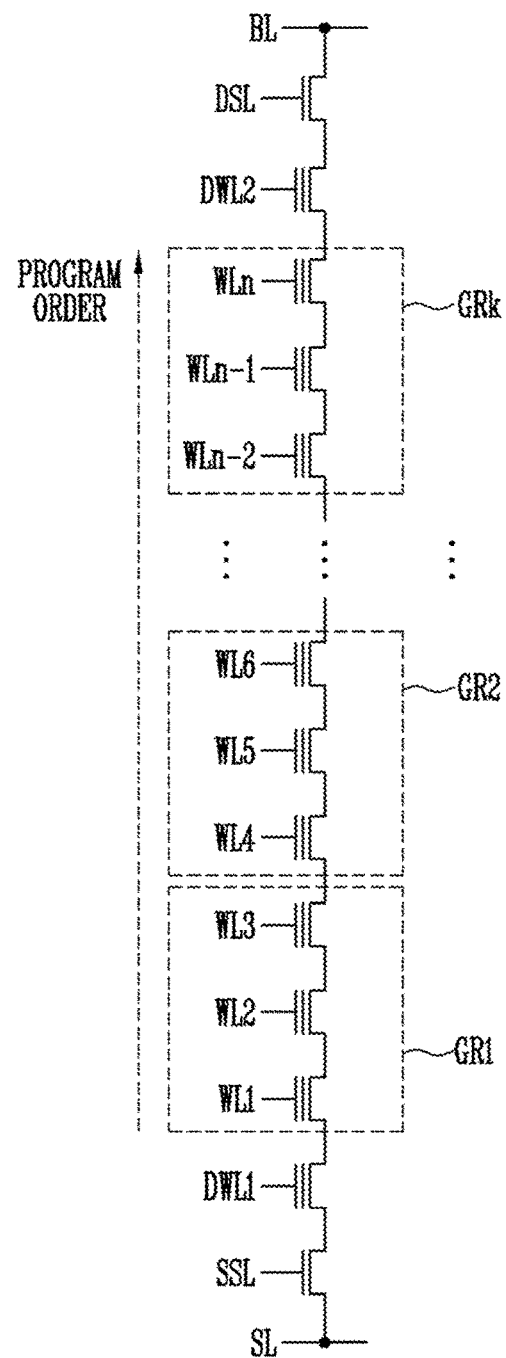
FIG. 11 is a diagram illustrating word line groups according to an embodiment of the invention.

FIG. 11 is a diagram illustrating word line groups according to an embodiment.

Referring to FIG. 11, the word lines WL1 to WLn may be divided into a plurality of groups GR1 to GRk, where k is a positive integer. Assuming that each group has three word lines, the first group GR1 may include first to third word lines WL1 to WL3 and a second group GR2 may include fourth to sixth word lines WL4 to WL6. In the same manner, the kth group GRk may include (n−2)th to nth word lines WLn−2 to WLn. A first dummy line DWL1 may be arranged between the source select line SSL and the first word line WL1, and a second dummy line DWL2 may be arranged between the nth word line WLn and the drain select line DSL. A program operation may be sequentially performed in a sequential order from the first word line WL1 to the nth word line WLn. Alternatively, the program operation may be performed in the opposite direction thereto.

Figure 12:
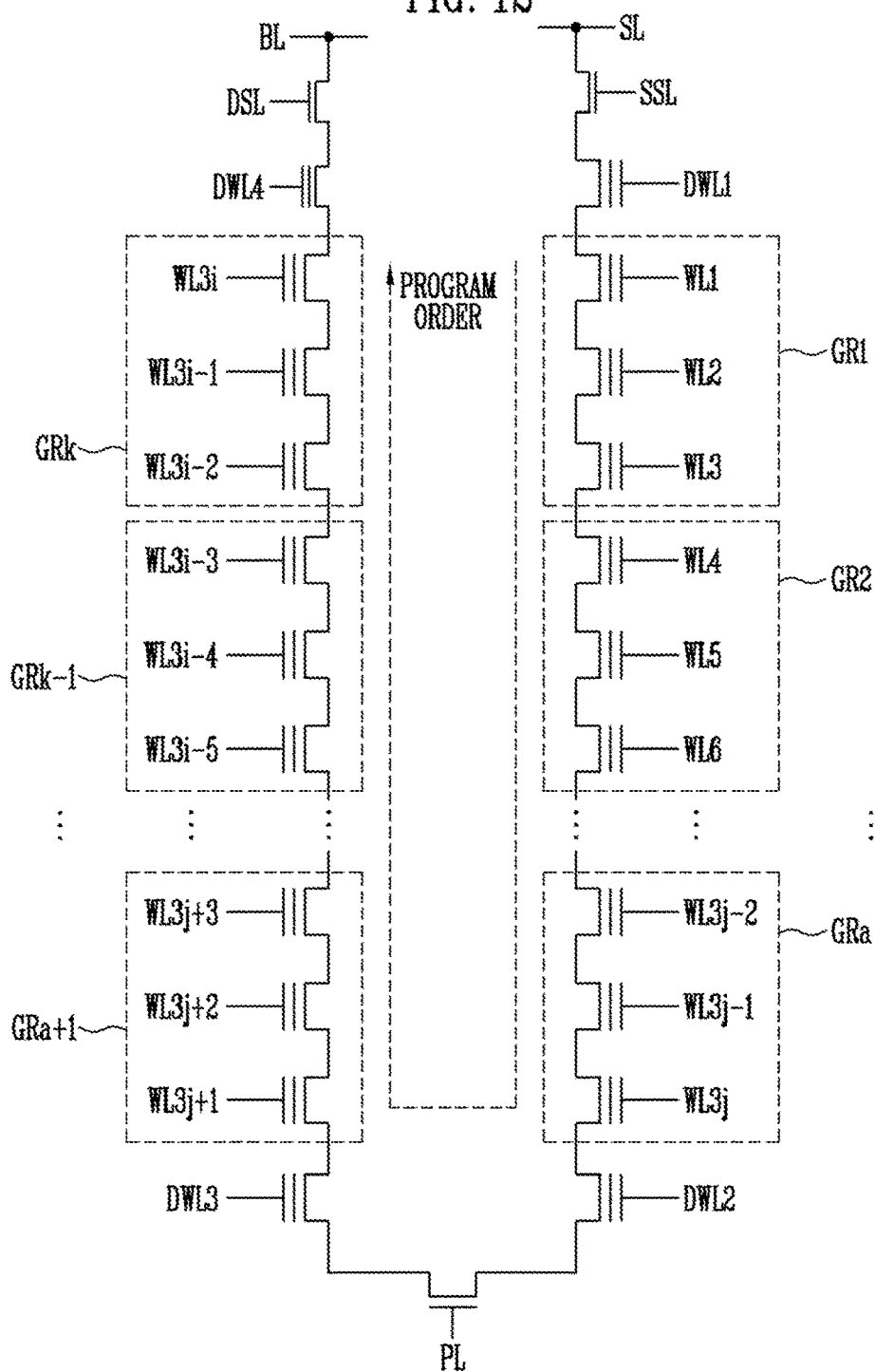
FIG. 12 is a diagram illustrating word line groups according to another embodiment.

FIG. 12 is a diagram illustrating word line groups according to another embodiment.

Referring to FIG. 12, a string may have a U shape which is different from the string shown in FIG. 11. The first dummy line DWL1 may be arranged between the source select line SSL and the first word line WL1, the second dummy line DWL2 may be arranged between a 3jth word line WL3j and the pipe line PL, and a third dummy line DWL3 may be arranged between the pipe line PL and a (3j+1)th word line WL3j+1. A fourth dummy line DWL4 may be arranged between a 3ith word line WL3i and the drain select line DSL.

The word lines WL1 to WL3i may be divided into a plurality of groups GR1 to GRa and GRa+1 to GRk, where a and k are positive integers. Assuming that each group has three word lines, the first to third word lines WL1 to WL3 may be included in the first group GR1, and the fourth to sixth word lines WL4 to WL6 may be included in the second group GR2. In the same manner, (3i−2)th to 3ith word lines WL3i−2 to WL3i may be included in the kth group GRk. A program operation may be performed in a sequential order from the first word line WL1 to the 3jth word line WL3j, and in a sequential order from the (3j+1)th word line WL3j+1 to the 3ith word line WL3i. However, the program operation may be performed in an opposite direction thereto.

The first to fourth groups GR1 to GR4 in the groups GR1 to GRk, described above with reference to FIGS. 11 and 13, are described below as an example.

Figure 13:
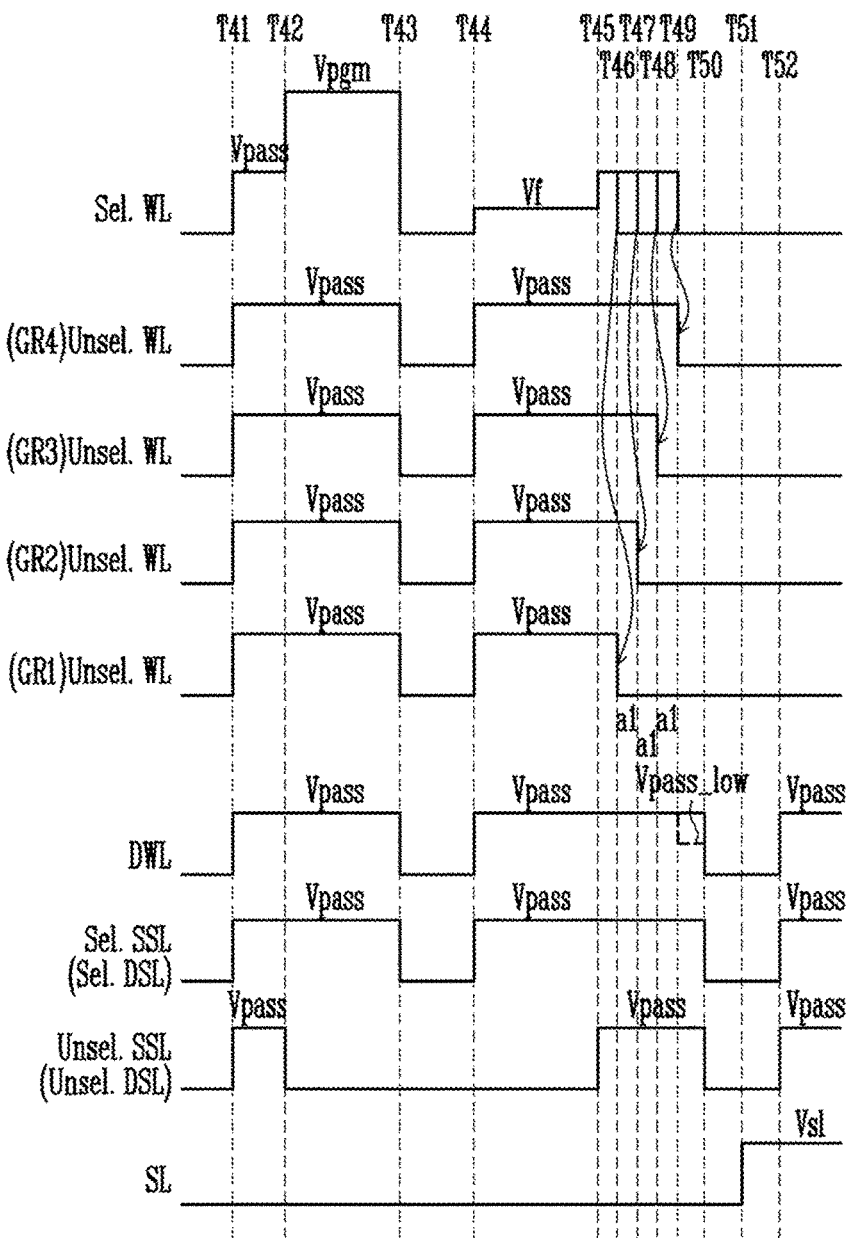
FIGS. 13 and 14 are diagrams illustrating a verify operation according to an embodiment.
Figure 14:
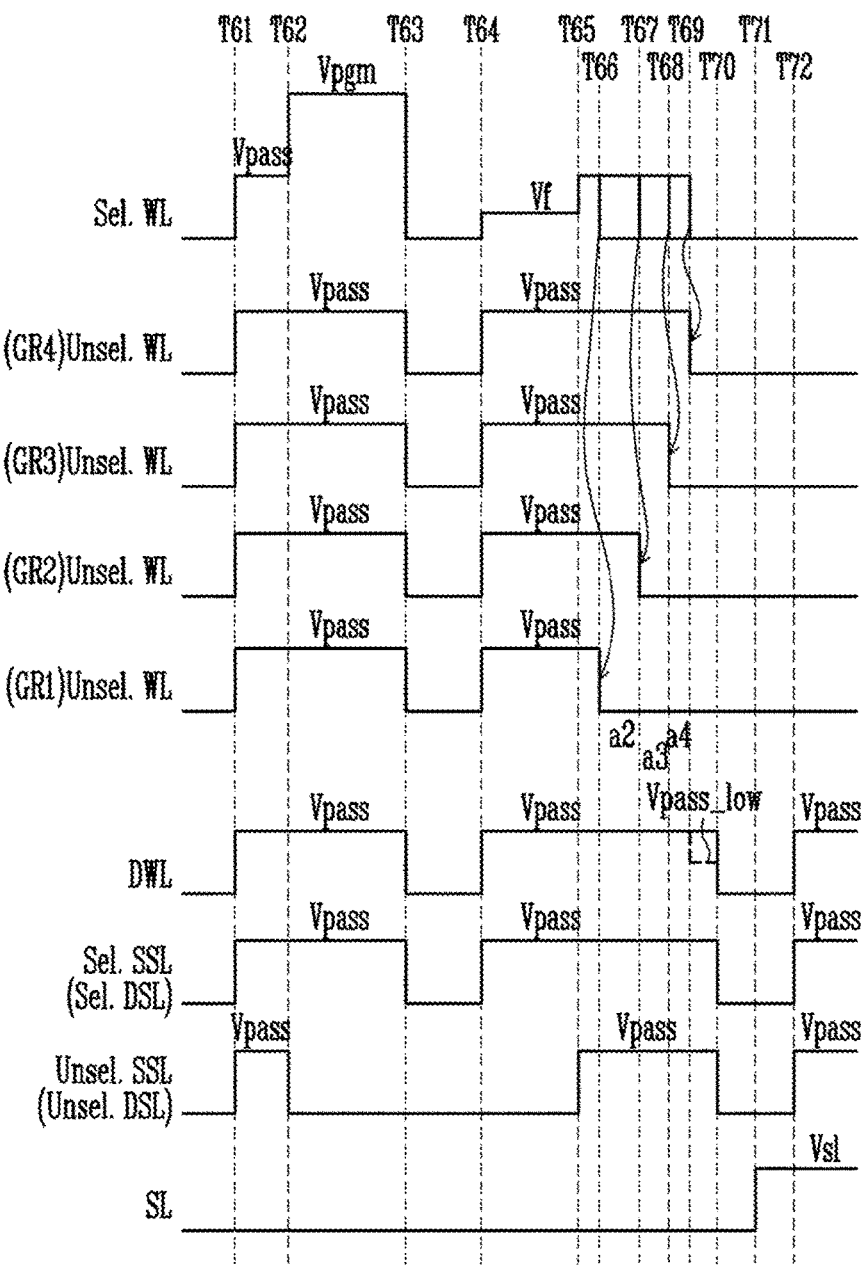

FIGS. 13 and 14 are diagrams illustrating a verify operation according to an embodiment.

FIG. 13 illustrates a single program loop.

The program loop shown in FIG. 13 may include a program period (T41 to T43), a first discharge period (43 to T44), a verify period (T44 to T45), an equalize period (T45 to T49), and a second discharge period (T49 to T51). A precharge period may start from T51. Each period will be described below in detail.

When the program period (T41 to T43) starts (T41), the pass voltages Vpass may be applied to the selected word line Sel. WL, the unselected word lines Unsel. WL, the selected source select lines Sel. SSL, and the selected drain select lines Sel. DSL (T41 to T42). According to a precharge method of the strings, the pass voltages Vpass or 0V may be selectively applied to the unselected source select lines Unsel. SSL and the unselected drain select lines Unsel. DSL.

The selected word line Sel. WL may be coupled to a target page of a program operation, and the unselected word lines Unsel. WL may be the remaining word lines, except the unselected word lines Unsel. WL. The selected source select lines Sel. SSL and the selected drain select lines Sel. DSL may be coupled to strings including program target memory cells, and the unselected source select lines Unsel. SSL and the unselected drain select lines Unsel. DSL may be coupled to the remaining strings.

When the strings are precharged by a positive voltage applied from the bit lines, the pass voltages Vpass may be applied to the unselected source select lines Unsel. SSL and the unselected drain select lines Unsel. DSL. On the other hand, when the strings are precharged by a positive voltage applied from the source line SL, the pass voltages Vpass may be applied to the unselected source select lines Unsel. SSL and the unselected drain select lines Unsel. DSL before the program period (T41 to T43). This will be described in connection with the precharge period (after T51).

When a program voltage applying period (T42 to T43) starts (T42), though not shown in FIG. 13, a program permission voltage or a program inhibition voltage may be applied to the bit lines in response to external data received from an external device (e.g., a memory controller) for a program operation. For example, the program permission voltage may be 0V and the program inhibition voltage may be a positive voltage. The unselected source select lines Unsel. SSL and the unselected drain select lines Unsel. DSL may be discharged, and a channel voltage of the unselected strings may be increased. The program voltage Vpgm may be applied to the selected word line Sel. WL.

When the program voltage Vpgm is applied to the selected word line Sel. WL for a predetermined time (T43), the first discharge period (T43 to T44) may be performed for the next operation.

All word lines Sel. WL and Unsel. WL, all source select lines Sel. SSL and Unsel. SSL, and the drain select lines Sel. DSL and Unsel. DSL, including the bit lines, may be discharged during the first discharge period (T43 to T44).

When the first discharge period finishes (T44), the verify period (T44 to T45) may be performed. When the verify period (T44 to T45) starts (T44), the pass voltages Vpass may be applied to the selected source select lines Sel. SSL, the selected drain select lines Sel. DSL, and the unselected word lines Unsel. WL. Further, the verify voltage Vf may be applied to the selected word line Sel. WL to verify memory cells coupled to the selected word line Sel. WL.

When the verify period (T44 to T45) finishes (T45), the equalize period (T45 to T49) may be performed for memory cells coupled to the selected word line Sel. WL during the second discharge period (T49 to T51).

A voltage applied to the selected word line Sel. WL may be increased to turn on the memory cells coupled to the selected word line Sel. WL during the equalize period (T45 to T49). For example, a turn on voltage having a similar level to the pass voltages Vpass may be applied to the selected word line Sel. WL. During the equalize period (T45 to T49), the pass voltages Vpass may also be applied to the unselected source select lines Unsel. SSL, the unselected word lines Unsel. WL, and the unselected drain select lines Unsel. DSL.

During the equalize period (T45 to T49), the word lines Sel. WL and Unsel. WL may be sequentially discharged in stages (T46 to T49). For example, the word lines Sel. WL and Unsel. WL included in the group on which the program operation is performed may start to be discharged by the peripheral circuits 200 according to a sequential order. For example, when a program operation starts to be performed in a direction from the first group GR1 to the fourth group GR4 in the same manner as the program operation described in FIGS. 11 and 12, the unselected word lines Unsel. WL included in the first group GR1 may start to be discharged first as shown in FIG. 13 (T46), the unselected word lines Unsel. WL included in the second group GR2 may then be discharged (T47). The unselected word lines Unsel. WL included in the same group may be discharged at the same time. The selected word line Sel. WL may also be discharged at the same time when the unselected word lines Unsel. WL in the group including the selected word line Sel. WL are discharged.

The word lines Sel. WL and Unsel. WL of each group may be discharged according to the programmed order for the following reasons.

Because unselected memory cells on which a program operation is performed have increased threshold voltages, over-programming may be prevented by a high voltage of a channel during a program operation of selected memory cells. A voltage of a channel may be reduced due to coupling when word lines are discharged during the equalize period (T45 to T49). Other unselected memory cells on which the program operation is not performed may be less affected because the unselected memory cells have lower threshold voltages. However, because the unselected memory cells on which the program operation is performed have higher threshold voltages, when a channel voltage is reduced, a program disturbance may occur. As a result, the threshold voltages thereof may be changed.

Therefore, as shown in the embodiment shown in FIG. 13, the memory cells on which the program operation has been completed may be discharged first, so that a program disturbance caused by the changed channel voltage may be prevented.

A method of operating the equalize period (T45 to T49) is described below in detail with reference to FIGS. 11 to 13.

The equalize period may start from T45. During the equalize period, a voltage of the selected word line Sel. WL may be increased to turn on all memory cells coupled to the selected word line Sel. WL. For example, at T45, the voltage of the selected word line Sel. WL may increase to the pass voltages Vpass. At T46, the unselected word lines Unsel. WL included in the first group GR1 may be discharged, and the pass voltages Vpass may continue to be supplied to the unselected word lines Unsel. WL included in the second to fourth groups GR2 to GR4. When the selected word line Sel. WL is included in the first group GR1, the selected word line Sel. WL may also be discharged at the same time as the unselected word lines Unsel. WL included in the first group GR1 are discharged. At T47, the unselected word lines Unsel. WL included in the second group GR2 may be discharged, and the pass voltages Vpass may continue to be supplied to the unselected word lines Unsel. WL included in the third and fourth groups GR3 and GR4. At T48, the unselected word lines Unsel. WL included in the third group GR3 may be discharged, and the pass voltages Vpass may continue to be supplied to the unselected word lines Unsel. WL included in the fourth group GR4. Lastly, at T49, the unselected word lines Unsel. WL included in the fourth group GR4 may be discharged. The pass voltages Vpass may continue to be supplied to the dummy lines DWL, the selected select lines Sel. SSL and Sel. DSL, and the unselected select lines Unsel. SSL and Unsel. DSL. When the selected word line Sel. WL is included in another group other than the first group GR1, the selected word line Sel. WL may be discharged at the same time as the unselected word lines Unsel. WL of the group including the selected word line Sel. WL is discharged. In other words, the control logic 300 may control the peripheral circuits 200 to apply the pass voltage Vpass to the selected word line selected word line Sel. WL, the unselected word lines Unsel. WL, and the select and unselect lines Sel. SSL, Sel. DSL, Unsel. SSL, and Unsel. DSL after verifying the memory cells.

The period (T46 to T47), the period (T47 to T48), and the period (T48 to T49) may be performed at the same time interval. For example, the respective periods may be sequentially performed at a first time interval a1. In other words, during the period (T46 to T47), the period (T47 to T48), and the period (T48 to T49), the word lines included in each of the first to fourth groups GR1 to GR4 may be sequentially discharged at the first time interval a1.

When all word lines Sel. WL and Unsel. WL are discharged (T49), the second discharge period (T49 to T51) may be performed. During the second discharge period (T49 to T51), the dummy lines DWL, the selected select lines Sel. SSL and Sel. DSL, and the unselected select lines Unsel. SSL and Unsel. DSL may be discharged (T50). Alternatively, the potential of the dummy lines DWL may be gradually reduced (Vpass_low) when the word lines of the last group, among the word lines, are discharged (T49), and may be discharged at T50. Thus, the control logic 300 of FIG. 2 may control the peripheral circuit 200 of FIG. 2 to sequentially discharge the word lines included in each of the first to fourth groups GR1 to GR4 before the select lines Sel. SSL, Sel. DSL, Unsel. SSL, and Unsel. DSL are discharged.

When all lines are discharged, a precharge period (after T51) may be performed for the next program loop. For example, when channels of strings are precharged through the source line SL, the source line voltage Vsl of a positive voltage may be applied to the source line SL (T51). Subsequently, when the pass voltages Vpass are applied to the select lines Sel. SSL Sel. DSL, Unsel. SSL, and Unsel. DSL, the channels may be precharged while the source line voltage Vsl is supplied to the strings. Though not shown in FIG. 13, when the channels of the strings are precharged, the source line SL and the select lines Sel. SSL, Sel. DSL, Unsel. SSL, and Unsel. DSL, may be discharged and the next program loop may be performed starting from T51.

A program operation shown in FIG. 14 may be performed in a similar manner to the program operation described above with reference to FIG. 13. However, there may be a difference in a time interval at which each of the groups GR1 to GR4 is discharged during an equalize period (T66 to T69). For example, at least one time interval may be different from the other time intervals. For example, the unselected word lines Unsel. WL included in the first group GR1 may be discharged first, and after a second time interval a2, the unselected word lines Unsel. WL included in the second group GR2 may be discharged. Subsequently, the unselected word lines Unsel. WL included in the third group GR3 may be discharged after a third time interval a3 shorter than the second time interval a2. Lastly, after a fourth time interval a4 shorter than the third time interval a3, the unselected word lines Unsel. WL included in the fourth group GR4 may be discharged. The selected word line Sel. WL may be discharged at the same time that the unselected word lines Unsel. WL of the group is discharged, where the unselected word lines Unsel. WL of the group includes the selected word line Sel. WL. Alternatively, the time intervals may be set to increase gradually. Thus, the peripheral circuits 200 of FIG. 2 may sequentially discharge the unselected word lines Unsel. WL and the selected word line Sel. WL included in the groups GR1, GR2, GR3, and GR4 by gradually increasing or decreasing the time interval.

FIGS. 13 and 14 are described based on the embodiment in which the word lines are divided into the four groups GR1 to GR4. However, the number of groups according to the invention is not limited thereto. In addition, when a program operation is performed in the opposite direction, the word lines may be sequentially discharged in a direction from the fourth group GR4 to the first group GR1.

The above-described embodiments relate to a verify operation of a program operation. However, the present technique is also applicable to a read operation, which will be described below in detail.

Figure 15:
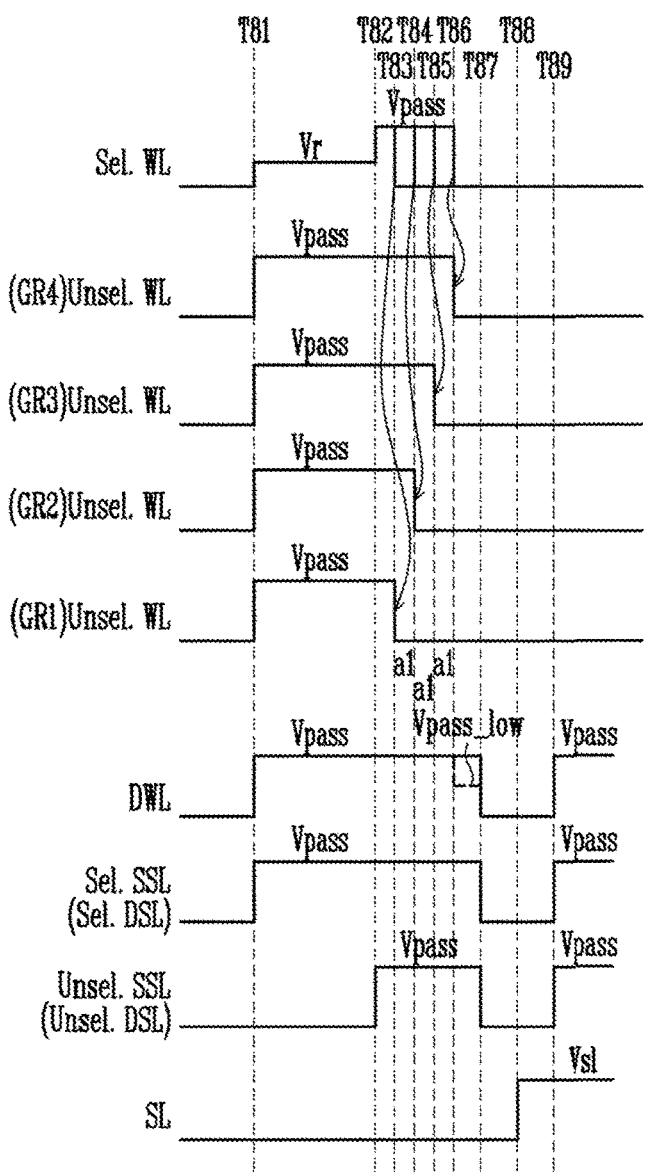
FIGS. 15 and 16 are diagrams illustrating a read operation according to an embodiment.
Figure 16:
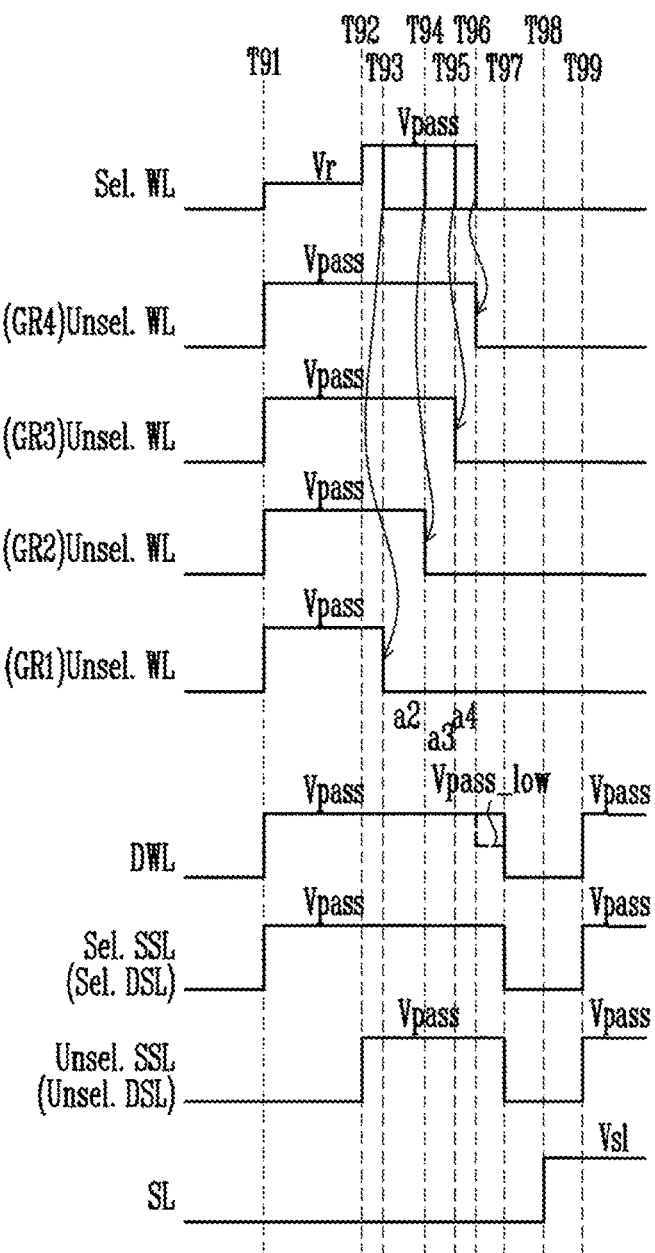

FIGS. 15 and 16 are diagrams illustrating a read operation according to an embodiment.

Referring to FIG. 15, a read operation may include a sensing period (T81 to T82), an equalize period (T82 to T86), a discharge period (T86 to T88), and a precharge period (T88 to T89).

When the sensing period (T81 to T82) starts (T81), the pass voltages Vpass may be applied to the selected source select lines Sel. SSL, the selected drain select lines Sel. DSL, and the unselected word lines Unsel. WL, and a read voltage Vr may be applied to the selected word line Sel. WL. For example, during the sensing period (T81 to T82), data of selected memory cells may be temporarily stored in the page buffer group 230 shown in FIG. 2, and the data temporarily stored in the page buffer group 230 may be sensed by the sensing circuit 260 shown in FIG. 2.

When the sensing period (T81 to T82) finishes (T82), the equalize period (T82 to T86) may be performed to prevent the potential of the selected word line Sel. WL from decreasing to a negative voltage during the discharge period (T86 to T88). During the equalize period (T82 to T86), a voltage applied to the selected word line Sel. WL may be increased to turn on the memory cells coupled to the selected word line Sel. WL. For example, a turn on voltage which is similar to the pass voltages Vpass may be applied to the selected word line Sel. WL. During the equalize period (T82 to T86), the pass voltages Vpass may continue to be supplied to the unselected source select lines Unsel. SSL, the unselected word lines Unsel. WL, and the unselected drain select lines Unsel. DSL. During the equalize period (T82 to T86), each group of the word lines Sel. WL and Unsel. WL may be sequentially discharged (T83 to T86). For example, the word lines Sel. WL and Unsel. WL included in the group on which the program operation is performed first may start to be discharged according to the sequential order.

A discharge occurring in the period (T83 to T84), the period (T84 to T85), and the period (T85 to T86) may be sequentially performed at the same time interval difference. For example, in each of the periods a discharge may be performed during the first time interval a1. In other words, during the period (T83 to T84), the period (T84 to T85), and the period (T85 to T86), the word lines included in each of the first to fourth groups GR1 to GR4 may be sequentially discharged at the first time interval a1.

When all lines are discharged (T87), a precharge period (after T88) may be performed for the next read operation. For example, when channels of strings are precharged through the source line SL, a positive source line voltage Vsl may be applied to the source line SL (T88). Subsequently, when the pass voltages Vpass are applied to the select lines Sel. SSL, Sel. DSL, Unsel. SSL, and Unsel. DSL, the channels may be precharged while the source line voltage Vsl is applied to the strings. Though not shown in FIG. 15, when the channels of the strings are precharged, the source line SL and the select lines Sel. SSL, Sel. DSL, Unsel. SSL, and Unsel. DSL may be discharged, the next read operation may be performed starting from T81.

A read operation shown in FIG. 16 may be performed in a similar manner to the read operation described above with reference to FIG. 15. However, there may be a difference in the time interval at which each of the groups GR1 to GR4 is discharged during an equalize period (T92 to T96). For example, the unselected word lines Unsel. WL included in the first group GR1 may be discharged first, and after the second time interval a2, the unselected word lines Unsel. WL included in the second group GR2 may be discharged. Subsequently, after the third time interval a3 shorter than the second time interval a2, the unselected word lines Unsel. WL included in the third group GR3 may be discharged. Lastly, after the fourth time interval a4 shorter than the third time interval a3 passes, the unselected word lines Unsel. WL included in the fourth group GR4 may be discharged. The selected word line Sel. WL may be discharged at the same time that the unselected word lines Unsel. WL is discharged, where the unselected word lines Unsel. WL includes the selected word line Sel. WL.

FIGS. 15 and 16 are described based on the embodiment in which the word lines are divided into the four groups GR1 to GR4. However, the number of groups according to the invention is not limited thereto. In addition, when a program operation is performed in the opposite direction, the word lines may be sequentially discharged in a direction from the fourth group GR4 to the first group GR1.

Figure 17:
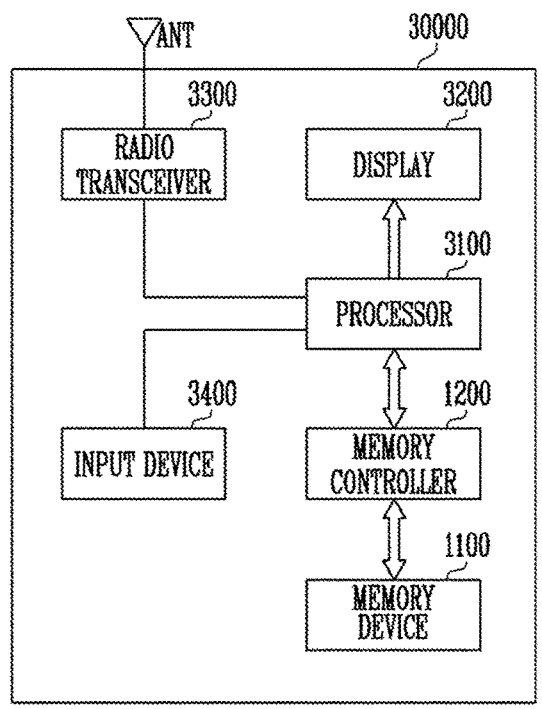
FIG. 17 is a diagram illustrating another embodiment of a memory system including a memory device shown in FIG. 2.

FIG. 17 is a diagram illustrating another embodiment of a memory system 30000 including the memory device 1100 shown in FIG. 12.

Referring to FIG. 17, the memory system 30000 may be embodied into a cellular phone, a smart phone, a tablet PC, a personal digital assistant (PDA), or a wireless communication device. The memory system 30000 may include the memory device 1100 and the memory controller 1200 controlling operations of the memory device 1100. The memory controller 1200 may control a data access operation of the memory device 1100, for example, a program operation, an erase operation, or a read operation in response to control of the processor 3100.

The memory controller 1200 may control data programmed into the memory device 1100 to be output through a display 3200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the semiconductor memory device 1100. In addition, the radio transceiver 3300 may change the signal output from the processor 3100 into a radio signal and output the radio signal to an external device through the antenna ANT. An input device 3400 may refer to a device to which a control signal for controlling operations of the processor 3100 or data to be processed by the processor 3100 is input. Examples of the input device 3400 may include a pointing device such as a touch pad or a computer mouse, a keypad, or a keyboard. The processor 3100 may control the operations of the display 3200 so that data output from the memory controller 1200, data output from the radio transceiver 3300, or data output from the input device 3400 may be output through the display 3200.

According to an embodiment, the memory controller 1200 controlling operations of the memory device 1100 may form part of the processor 3100, or be formed as a separate chip from the processor 3100.

Figure 18:
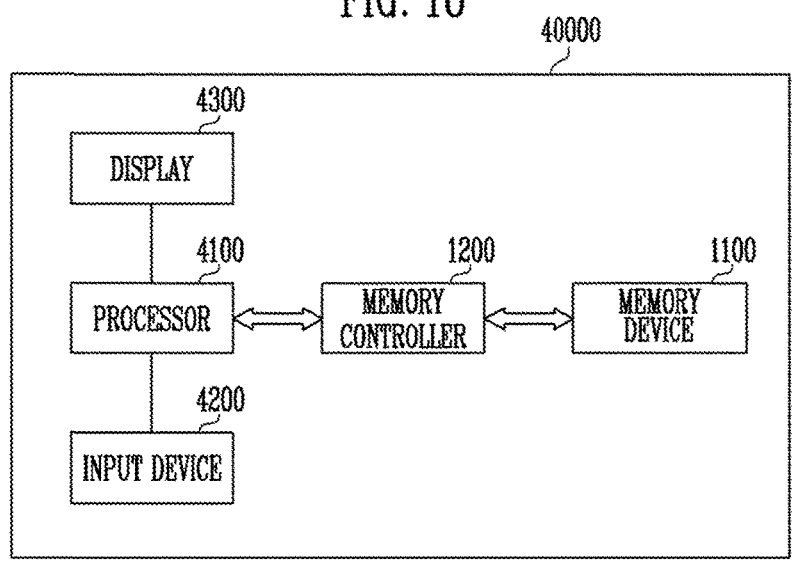
FIG. 18 is a diagram illustrating another embodiment of a memory system including a memory device shown in FIG. 2.

FIG. 18 is a diagram illustrating another embodiment of a memory system 40000 including the memory device 1100 shown in FIG. 2.

Referring to FIG. 18, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

The processor 4100 may output data stored in the memory device 1100 according to data input through the input device 4200. Examples of the input device 4200 may include a pointing device such as a touch pad or a computer mouse, a keypad, or a keyboard.

The processor 4100 may control general operations of the memory system 40000 and control operations of the memory controller 1200. According to an embodiment, the memory controller 1200 controlling operations of the memory device 1100 may be part of the processor 4100, or be formed as a separate chip from the processor 4100.

Figure 19:
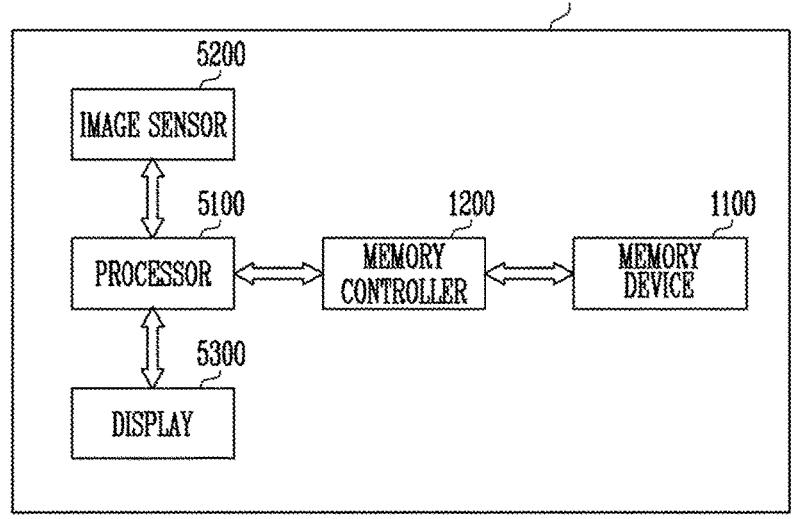
FIG. 19 is a diagram illustrating another embodiment of a memory system including a memory device shown in FIG. 2.

FIG. 19 is a diagram illustrating another embodiment of a memory system including the memory device 1100 shown in FIG. 2.

Referring to FIG. 19, a memory system 50000 may be embodied into an image processor, for example, a digital camera, a cellular phone with an attached digital camera, a smartphone with an attached digital camera, or a table PC with an attached digital camera.

The memory system 50000 may include the memory device 1100 and the memory controller 1200 controlling a data processing operation of the memory device 1100, for example, a program operation, an erase operation, or a read operation.

An image sensor 5200 of the memory system 50000 may convert an optical image into digital signals, and the converted digital signals may be transferred to the processor 5100 or the memory controller 1200. In response to control of the processor 5100, the converted digital signals may be output through the display 5300 or stored in the semiconductor memory device 1100 through the memory controller 1200. In addition, data stored in the memory device 1100 may be output through the display 5300 according to control of the processor 5100 or the memory controller 1200.

According to an embodiment, the memory controller 1200 controlling operations of the memory device 1100 may form part of the processor 5100, or be formed as a separate chip from the processor 5100.

Figure 20:
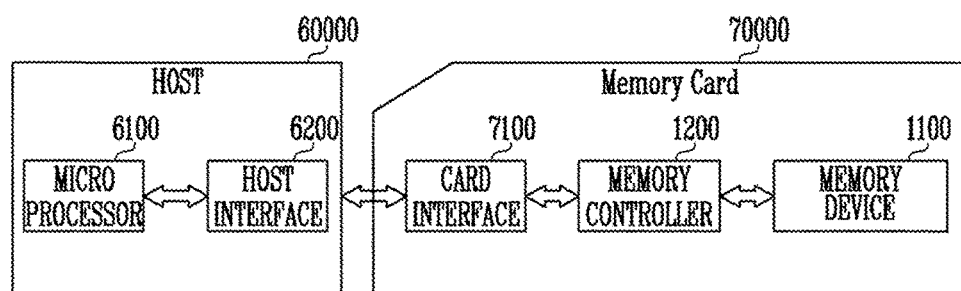
FIG. 20 is a diagram illustrating another embodiment of a memory system including a memory device shown in FIG. 2.

FIG. 20 is a diagram illustrating another embodiment of a memory system including the memory device 1100 shown in FIG. 2.

Referring to FIG. 20, a memory system 70000 may include a memory card or a smart card. The memory system 70000 may include the memory device 1100, the memory controller 1200, and a card interface 7100.

The memory controller 1200 may control data exchanged between the semiconductor memory device 1100 and the card interface 7100. According to an embodiment, the card interface 7100 may be a secure digital (SD) card interface or a multi-media card (MMC) interface. However, the invention is not limited thereto.

The card interface 7100 may interface data exchanged between a host 60000 and the memory controller 1200 according to a protocol of the host 60000. According to an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top box, the host interface 6200 may perform data communications with the memory device 1100 through the card interface 7100 and the memory controller 1200 in response to control of the microprocessor 6100.

According to the present technique, the reliability of a verify operation and a read operation of a memory device may be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:
1. A memory device, comprising:
 a memory block coupled to a plurality of word lines arranged in parallel with each other between a first select line and a second select line, wherein the word lines are coupled to memory cells, the first select line is coupled to a first selection transistor, and the second select line is coupled to a second selection transistor;
 peripheral circuits supplying a verify voltage and a pass voltage to the first select line, the second select line, and the word lines, selectively discharging the first select line, the second select line, and the word lines, and verifying the memory cells coupled to a selected word line of the word lines; and a control logic controlling the peripheral circuits so that potentials of the selected word line, unselected word lines, and the first and second select lines are the same as each other after verifying the memory cells, and the first and second select lines are discharged after discharging the selected and unselected word lines.

2. The memory device of claim 1, wherein the peripheral circuits apply the verify voltage to the selected word line and the pass voltage to the unselected word lines and the first and second select lines when verifying the memory cells.

3. The memory device of claim 2, wherein the verify voltage is set to be lower than the pass voltage.

4. The memory device of claim 1, wherein the control logic controls the peripheral circuits to increase a potential of the selected word line after verifying the memory cells.

5. The memory device of claim 4, wherein the control logic controls the peripheral circuits to apply the pass voltage to the selected word line, the unselected word lines, and the first and second select lines after verifying the memory cells.

6. The memory device of claim 1, wherein the word lines are divided into a plurality of groups.

7. The memory device of claim 6, wherein the selected word line is discharged at the same time as unselected word lines of a group including the selected word line are discharged.

8. The memory device of claim 6, wherein the control logic controls the peripheral circuits to sequentially discharge the word lines according to each group before the first and second select lines are discharged.

9. The memory device of claim 8, wherein the peripheral circuits sequentially discharge the word lines included in the groups in an order in which a program operation is performed.

10. The memory device of claim 8, wherein the peripheral circuits simultaneously discharge the word lines included in a same group, among the groups.

11. The memory device of claim 8, wherein the peripheral circuits sequentially discharge the word lines included in the groups at a same time interval, or sequentially discharge the word lines included in the groups by setting at least one time interval to be different from remaining time intervals.

12. The memory device of claim 8, wherein the peripheral circuits sequentially discharge the word lines included in the groups by increasing or decreasing a time interval.

13. The memory device of claim 1, wherein the memory block further comprises:

a first dummy line arranged between the first select line and the word lines; and a second dummy line arranged between the second select line and the word lines.

14. The memory device of claim 13, wherein the peripheral circuits control a voltage applied to the first and second dummy lines to be the same as a voltage applied to the first and second select lines.

15. The memory device of claim 13, wherein the peripheral circuits discharge the first and second dummy lines after discharging the selected and unselected word lines.

16. The memory device of claim 13, wherein the peripheral circuits discharge the first and second dummy lines in stages when discharging the selected and unselected word lines.

17. A method of operating a memory device, the method comprising:

applying pass voltages to unselected word lines, among word lines coupled to memory cells, and select lines coupled to selection transistors;

verifying the memory cells coupled to a selected word line, among the word lines, by applying a verify voltage to the selected word line;

applying a turn on voltage to the selected word line when the pass voltages are applied to the unselected word lines and the select lines;

discharging the selected word line and the unselected word lines; and discharging the select lines after discharging the selected word line and the unselected word lines.

18. The method of claim 17, wherein the turn on voltage is set to a voltage by which the memory cells coupled to the selected word line are turned on.

19. The method of claim 17, wherein when dummy lines are arranged between the word lines and the select lines, the dummy lines are controlled in the same manner as the select lines.

20. The method of claim 17, wherein when dummy lines are arranged between the word lines and the select lines, the pass voltages are applied to the dummy lines when the pass voltages are applied to the select lines, a potential of the dummy lines decreases when the word lines are discharged, and the dummy lines are discharged when the select lines are discharged.

21. The method of claim 17, wherein the discharging of the selected word line and the unselected word lines comprises dividing the word lines including the selected word line and the unselected word lines into a plurality of groups, and sequentially discharging the plurality of groups.

22. The method of claim 21, wherein the groups are sequentially discharged at a same time interval.

23. The method of claim 21, wherein the groups are sequentially discharged at different time intervals.

* * * * *